(12) United States Patent
Schafstall et al.

(10) Patent No.: US 10,915,678 B1
(45) Date of Patent: Feb. 9, 2021

(54) SURFACE MAPPING APPARATUSES AND METHODS

(71) Applicant: MSC.Software Corporation, Newport Beach, CA (US)

(72) Inventors: Hendrik Schafstall, Hamburg (DE); Peter Kraft, Hamburg (DE)

(73) Assignee: MSC.Software Corporation, Newport Beach, CA (US)

( * ) Notice: Subject to any disclaimer, the term of this patent is extended or adjusted under 35 U.S.C. 154(b) by 861 days.

(21) Appl. No.: 15/388,976

(22) Filed: Dec. 22, 2016

(51) Int. Cl.
*G06F 17/10* (2006.01)
*G06F 30/23* (2020.01)
*G06F 17/16* (2006.01)

(52) U.S. Cl.
CPC .............. *G06F 30/23* (2020.01); *G06F 17/16* (2013.01)

(58) Field of Classification Search
CPC ...... G06F 30/23; G06F 17/10; G06F 2111/10; G06F 17/50; G06T 17/20; G06T 17/00; G06T 7/11
See application file for complete search history.

(56) References Cited

U.S. PATENT DOCUMENTS

| | | | | |
|---|---|---|---|---|
| 7,898,540 | B2 * | 3/2011 | Usami | G06T 17/20 345/424 |
| 9,842,411 | B2 * | 12/2017 | Milne | G06T 19/20 |
| 10,255,381 | B2 * | 4/2019 | Walle | G06F 30/00 |
| 2008/0275677 | A1 * | 11/2008 | Landon | G06F 17/5018 703/2 |
| 2011/0087350 | A1 * | 4/2011 | Fogel | G06F 17/50 700/98 |
| 2014/0375636 | A1 * | 12/2014 | Young | G06F 17/50 345/420 |
| 2015/0178424 | A1 * | 6/2015 | Harkness | G06F 17/5018 703/1 |
| 2016/0042106 | A1 * | 2/2016 | Chauhan | G06F 17/5018 703/1 |
| 2016/0224693 | A1 * | 8/2016 | Maisonneuve | G06T 19/20 |
| 2016/0275207 | A1 * | 9/2016 | Qian | G06F 17/50 |
| 2017/0228474 | A1 * | 8/2017 | Benjamin | G06F 17/50 |
| 2017/0372480 | A1 * | 12/2017 | Anand | G06F 17/5009 |

(Continued)

OTHER PUBLICATIONS

Li et al. Isogeometric Analysis With Trimming Technique for Quadruple Arch-Cut Ridge Circle Waveguide Int. Journal Numerical Model, 2017, pp. 1-19, Published Online Jul. 14, 2016 in Wiley Online Library (Year: 2016).*

(Continued)

*Primary Examiner* — Rehana Perveen
*Assistant Examiner* — Cuong V Luu
(74) *Attorney, Agent, or Firm* — Foley & Lardner LLP

(57) ABSTRACT

Examples described herein relate to apparatuses and methods for performing simulation of a model of a physical object, including but not limited to, mapping mesh simulation results obtained from a finite element simulation of a finite element mesh of the model to a surface representation of the model by performing the finite element simulation using the finite element mesh to obtain the mesh simulation results, and determining arbitrary results with respect to the surface representation based on the mesh simulation results, and displaying the arbitrary results with respect to the surface representation, wherein the finite element mesh is defined independently of the surface representation.

11 Claims, 8 Drawing Sheets

(56) References Cited

U.S. PATENT DOCUMENTS

2019/0270252 A1\* 9/2019 Iorio .................. G05B 19/4099
2019/0303532 A1\* 10/2019 Urick ...................... G06T 17/30

OTHER PUBLICATIONS

Sevilla et al. 3D NURBS-Enhanced Finite Element Method Applied Science and engineering, 2008 (Year: 2008).\*
Hartmann et al. About Isogeometric Analysis and the New NURBS-Based Finite Elements in LS-DYNA 8th European LS-DYNA Users Conference, May 23, 2011 (Year: 2011).\*
Brazilevs et al. 3D Simulation of Wind Turbine Rotors at Full Scale. Part I: Geometry Modeling and Aerodynamics Int. J. Numer. Meth. Fluids, 2010 (Year: 2010).\*
Huang et al. Isogeometric Analysis of the Nonlinear Deformation of Planar Flexible Beams with Snap-back Acta Mechanica Solida Sinica, vol. 29, No. 4 Aug. 2016 (Year: 2016).\*
Li et al. NURBS-Based Isogeometric Analysis of Beams and Plates Using High Order Shear Deformation Theory Mathmatical Problems in Engineering, vol. 2013, Article ID 159027 (Year: 2013).\*
Nguyen et al. Isogeometric Analysis: An Overview and Computer Implementation Aspects Elsevier, Sep. 2013 (Year: 2013).\*
Hughes et al. Isogeometric Analysis: CAD, Finite Elements, NURBS, Exact Geometry and Mesh Refinement Comut. Methods Appl. Mech Engrg. 194, 2005, pp. 4135-4195 (Year: 2005).\*

\* cited by examiner

SURFACE MAPPING APPARATUSES AND METHODS

BACKGROUND

A finite element mesh (e.g., a voxel mesh) includes elements (e.g., finite elements) filling up a volume of a model. In some instances, the finite element mesh is not a geometric representation of the model. In such cases, the finite element mesh is independent of the geometric representation of the model (e.g., a surface representation of the model), given that no linkage exists between the finite element mesh and the geometric representation. Through Finite Element Method (FEM) or Finite Element Analysis (FEA), structural quantity such as deformation as well as other characteristics of the model can be obtained. However, the results of such analysis are traditionally not transferable to the geometric representation of the model.

SUMMARY OF THE INVENTION

Examples described herein related to a method for performing simulation of a model of a physical object, including mapping mesh simulation results obtained from a finite element simulation of a finite element mesh of the model to a surface representation of the model by performing the finite element simulation using the finite element mesh to obtain the mesh simulation results and determining arbitrary results with respect to the surface representation based on the mesh simulation results, and displaying the arbitrary results with respect to the surface representation, wherein the finite element mesh is defined independently of the surface representation.

In some examples, the model is a 3-dimensional solid. Performing the finite element simulation using the finite element mesh comprises performing the finite element simulation using Finite Element Method (FEM) or Finite Element Analysis (FEA). The mesh simulation results are numerical results.

In various examples, each finite element of the finite element mesh is associated with a shape function or interpolation function. Each finite element of the finite element mesh is one of a 4-node tetrahedron, 5-node pyramid, 6-node pentahedron, 8-node hexahedron, 10-node tetrahedron, 13-node pyramid, 15-node pentahedron, or 20-node hexahedron.

In some examples, the surface representation of the model comprises one or more Non-Uniform Rational Basis Spline (NURBS) surfaces. Each of the one or more NURBS surfaces is defined by one or more control points and one or more knot vectors associated with the one or more control points.

In some examples, each of the one or more control points has an initial control point position. each initial control point position is associated with an idealized point. The idealized point is a point within a volume of or on a surface of the finite element mesh. The idealized point is defined by isoparametric coordinates.

In some examples, performing the finite element simulation using the finite element mesh to obtain the mesh simulation results comprises determining the mesh simulation results with respect to nodes or integration points of the finite element mesh.

In some examples, determining the arbitrary results with respect to the surface representation based on the mesh simulation results comprises mapping the mesh simulation results with respect to the nodes or the integration points to the idealized points using a mapping function.

In some examples, the mapping function is based on interpolation functions of elements if the finite element mesh or based on a weighted average of a collection of nearby nodes.

In some examples, each of the idealized points is at a same physical location as a corresponding control point. Each of the control points inherit displacement and all other arbitrary quantities of the corresponding idealized point.

In some examples, the surface representation comprises discrete patches. Each of the discrete patches is defined by one or more discrete patch positions or surface points.

In some examples, each of the one or more surface points has an initial surface point position. Each initial surface point position is associated with an idealized point. The idealized point is a point within a volume of or on a surface of the finite element mesh. The idealized point is defined by isoparametric coordinates.

In some examples, performing the finite element simulation using the finite element mesh to obtain the mesh simulation results comprises determining the mesh simulation results with respect to nodes or integration points of the finite element mesh.

In some examples, determining the arbitrary results with respect to the surface representation based on the mesh simulation results comprises mapping the mesh simulation results with respect to the nodes or the integration points of the finite element mesh to the idealized points using a mapping function.

In some examples, the mapping function is based on interpolation functions of elements if the finite element mesh or based on a weighted average of a collection of nearby nodes.

In some examples, each of the idealized points is at a same physical location as a corresponding surface point. Each of the surface points inherit displacement and all other arbitrary quantities of the corresponding idealized point.

In various examples, a non-transitory computer-readable medium having computer-readable instructions such that, when executed by a processor, causes the processor to perform simulation of a model of a physical object by mapping mesh simulation results obtained from a finite element simulation of a finite element mesh of the model to a surface representation of the model by performing the finite element simulation using the finite element mesh to obtain the mesh simulation results and determining arbitrary results with respect to the surface representation based on the mesh simulation results, and displaying the arbitrary results with respect to the surface representation, wherein the finite element mesh is defined independently of the surface representation.

In some examples, an apparatus capable of performing simulation of a model of a physical object, the apparatus comprises a memory, a processor configured to map mesh simulation results obtained from a finite element simulation of a finite element mesh of the model to a surface representation of the model by perform the finite element simulation using the finite element mesh to obtain the mesh simulation results, and determine arbitrary results with respect to the surface representation based on the mesh simulation results, and a user interface configured to display the arbitrary results with respect to the surface representation, wherein the finite element mesh is defined independently of the surface representation.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

The detailed description set forth below in connection with the appended drawings is intended as a description of various aspects of the present disclosure and is not intended to represent the only aspects in which the present disclosure can be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure can be practiced without these specific details. In some instances, structures and devices are shown in block diagram form in order to avoid obscuring the concepts of the present disclosure. Acronyms and other descriptive terminology can be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with one or more aspects.

Referring generally to the FIGS., examples described herein relate to apparatuses and methods for determining and/or displaying arbitrary results for a geometric representation of a model based on mesh simulation results (e.g., numerical results) obtained from Finite Element Method (FEM) or Finite Element Analysis (FEA). Particularly, a finite element mesh (e.g., a voxel mesh) may be generated or otherwise defined for the model independently of the geometric representation (e.g., a surface representation) of the model. The mesh simulation results from FEM or FEA can be mapped onto corresponding arbitrary results for the geometric representation.

Figure 1:
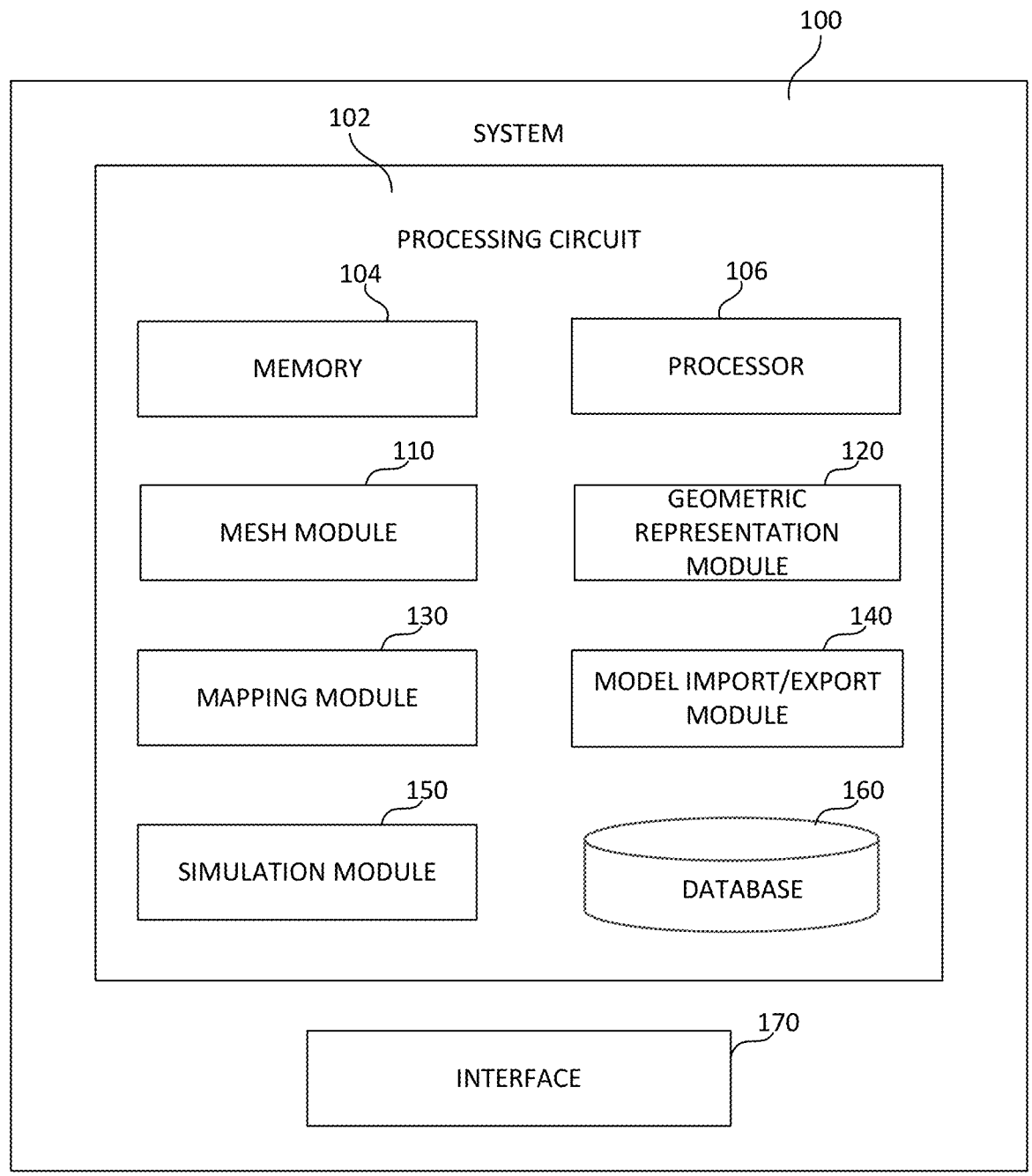
FIG. 1 is a block diagram illustrating an example of a system according to various examples.

FIG. 1 is a block diagram illustrating an example of a system 100 according to various examples. Referring to FIG. 1, the system 100 can include at least a mesh module 110, a geometric representation module 120, a mapping module 130, a model import/export module 140, and a simulation module 150 to implement features described herein. In particular, each of the mesh module 110, geometric representation module 120, mapping module 130, model import/export module 140, and simulation module 150 can be a module capable of virtually performing one or more of mesh elements definition with respect to a model, geometric representation definition of the model, mapping between a finite element mesh and the geometric representation of the model, simulation functionalities to determine mesh simulation results, or arbitrary results conversion/determination based on the mesh simulation results. The system 100 can be executed on a FEA/FEM platform as well as other suitable computing or simulation platforms.

In some examples, the system 100 may include a processing circuit 102 and an interface 170. The processing circuit 102 can be part of a workstation computer or other suitable types of computing device. The processing circuit 102 can include the various modules 110-150 for executing the various functions described herein. The processing circuit 102 may include a memory 104, processor 106, and database 160. The system 100 may include other suitable devices such as a network system, wireless or wired communications systems, printers, and/or the like for performing various functions described herein.

The processor 106 may include any suitable data processing device, such as a general-purpose processor (e.g., a microprocessor). In the alternative, the processor 106 may be any conventional processor, controller, microcontroller, or state machine. The processor 106 may be implemented as a combination of computing devices, e.g., a combination of a Digital Signal Processor (DSP) and a microprocessor, a plurality of microprocessors, at least one microprocessors in conjunction with a DSP core, or any other such configuration. For example, the processor 106 may be, but is not limited to being, an Intel® designed processor, AMD® designed processor, Apple® designed processor, QUALCOMM® designed processor, or ARM® designed process. The processor 106 may be used to implement features of the various modules 110-150.

The memory 104 (or storage device) can be operatively coupled to the processor 106 and can include any suitable device for storing software instructions and data for controlling and use by the processor 106 to perform operations and functions described herein. Examples of the memory 104 include, but not limited to, Random Access Memory (RAM), Read Only Memory (ROM), floppy disks, hard disks, dongles or other Recomp Sensor Board (RSB) connected memory devices, or the like. The memory 104 can include non-transitory storage media that is configured to store information and instructions pertinent to the operation of the processor 106.

The memory 104 can send data to or receive data from the processor 106 and/or each of the modules/components 110-160 in the system 100. In some examples, the memory 104 can be a remote storage device that stores data for the system 100 (or only the processing circuit 102) in a different node of a network than that on which the processing circuit 102 and/or the system 100 reside. In other examples, the memory 104 can be located on the same computer system (e.g., within the same node of the network) as the processing circuit 102 and/or the system 100. In other examples, one or more of the modules 110-150 can be implemented with a dedicated memory unit that is separate from the memory 104.

The processor 106 can be coupled to or otherwise include one or more or all of the modules 110-150 in the system 100 for performing the functionalities of each module 110-150. For example, the processor 106 can implement the mesh module 110 for generating a finite element mesh (e.g., a voxel mesh) having regular elements for a model, where the finite element mesh is defined independently of any surface representation of the model. The processor 106 can perform such actions of the mesh module 110 automatically or based on (e.g., triggered by) user input. The user input can be received via an input device of the interface 170. The mesh module 110 (e.g., the processor 106) may be coupled to a display device of the interface 170 and may cause the display device to graphically display the mesh to a user.

The processor 106 can implement the geometric representation module 120. The geometric representation module 120 may define, based on user input or automatically based on suitable mechanism, a geometric representation (e.g., a surface representation) of the model. The geometric representation module 120 (e.g., the processor 106) may be coupled to a display device of the interface 170 and may cause the display device to graphically display the geometric representation to a user.

The processor 106 can implement the mapping module 130 for determining appropriate mapping or correspondence between the finite element mesh and the geometric representation of the model in the manner described. In further examples, the mapping module 130 is configured for determining appropriate mapping or correspondence between the mesh simulation results and the arbitrary results with respect to the surface representation in the manner described.

The processor 106 can implement the model import/export module 140 to import and/or export models. In some examples, the model import/export module 140 can be configured to import model data from another memory device or another system. The model import/export module 140 can send model information corresponding to the imported model to one or more or all of the modules 110-150 in the system 100. The model import/export module 140 can export the model to memory device or another system. In some examples, the model data may be received as user input via the input device of the interface 170. The model data may be stored in the memory 104 and/or the database 160.

The processor 106 can implement the simulation module 150 to perform simulations (FEA or FEM) for the model (generated or imported) using the finite element mesh in the manner described. In some examples, the database 160 can be any non-transitory storage medium capable of storing data. For example, the database 160 can store model information, finite element mesh information, geometric representation information, mapping information, mesh simulation results, arbitrary results, and/or the like.

The interface 170 can include at least one input device for receiving input from the user and at least one display device for relaying information to the user. For example, the input device can include a computer with a monitor, keyboard, keypad, mouse, joystick, touch screen display, or other input devices performing a similar function. The keyboard can include alphanumeric and other keys, and can be connected to processing circuit 102 (e.g., the processor 106 and the memory 104) for communicating information and command selections. The input device can include a touch screen interface or movement sensing interface that can be combined with, or separated from, the display device of the interface 170. The input device can include a cursor control device, such as, but not limited to, a mouse, trackball, touch screen, motion sensor, cursor direction keys, and the like. Such input device can control cursor movement on the display device. The display device of the interface 170 can be any type of display (e.g., Cathode Ray Tube (CRT) display, Liquid Crystal Display (LCD), etc.) configured to provide audio and/or visual output to the user.

As referred to herein, a model may refer to a 3-dimensional solid representing a physical object, the behavior of which being subject to modeling and simulation in the manner described. A finite element mesh defined for the model may be composed of discrete 3-dimensional elements filling up a volume that the solid occupies. In a non-limiting example involving voxel meshes, the discrete elements may be regular elements of a same size, shape, and volume. A geometric representation of the model may be include a surface enclosing the solid, as in the case of a surface representation. The closed surface may be a discretized or continuous surface. For instance, the discretized surface may be represented by triangular patches, quadrilateral patches, or patches having another suitable shape. The continuous surface may be represented by Bezier surfaces, Coons surfaces, Non-Uniform Rational Basis Spline (NURBS) surfaces, or another suitable type of surfaces.

Figure 2:
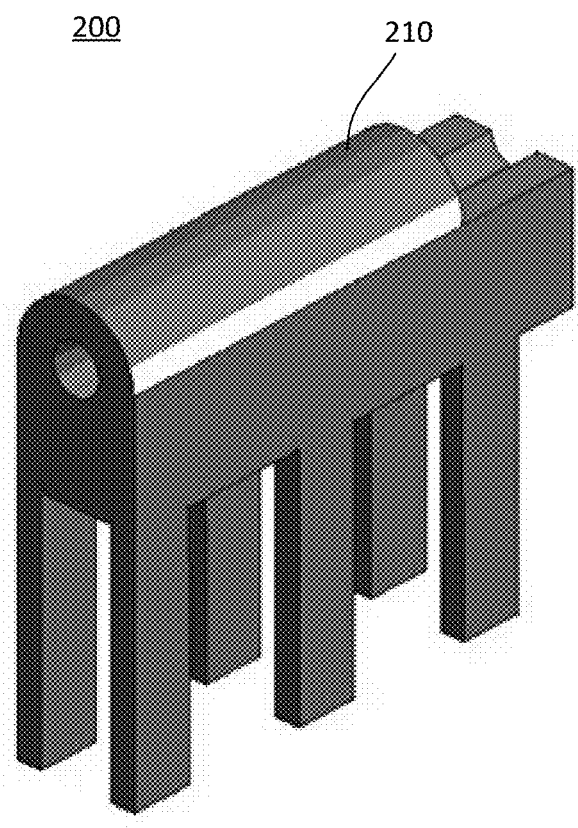
FIG. 2 is a diagram illustrating a perspective view of a geometric representation (e.g., a continuous surface representation) of a model representing a physical object.

FIG. 2 is a diagram showing a model 200 representing a physical object. The model 200 may be geometrically represented by a surface 210 (e.g., a surface representation). The surface 210 shown may be a closed surface in some implementations. The surface 210 may be represented by or otherwise include one or more Non-Uniform Rational Basis Spline (NURBS) surfaces. A NURBS surface may have an initial NURBS surface position. The initial NURBS surface position may be an initial position in which the NURBS surface is prior to executing any mesh simulation). Each NURBS surface of the surface 210 may be characterized by one or more control points and one or more knot vectors. The control points can define the shape of a NURBS surface. The knot vectors may include parameters indicative of positions and manners in which the control points can represent the NURBS surface. Each control point may have an initial control point position, which is an initial position of the control point prior to executing any mesh simulation.

Figure 3:
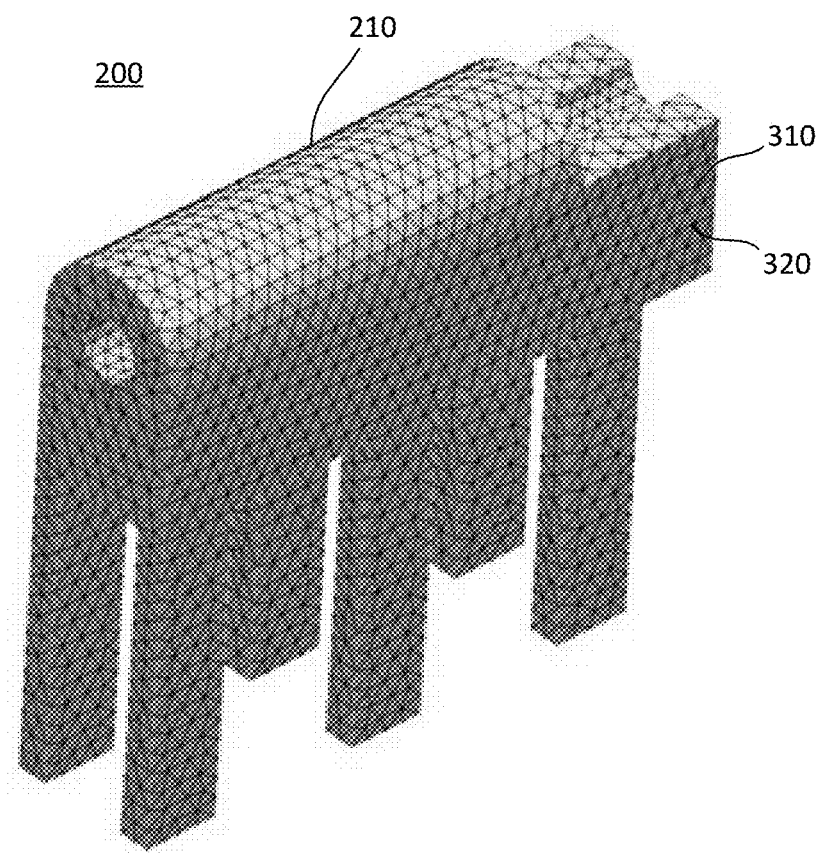
FIG. 3 is a diagram illustrating a perspective view of a geometric representation (e.g., a discretized surface representation) of a model representing a physical object.

In other examples, the surface 210 may be discretized and include discrete patches. Examples of the discrete patches may include, but not limited to, triangular patches, quadrilateral patches, a combination thereof, or the like. Illustrating with a non-limiting example, FIG. 3 is a diagram showing that surface 210 the model 200 composed of discrete patches (e.g., discrete patch 310). Each discrete patch may have an initial discrete patch position. The initial discrete patch position may be an initial position of the discrete patch prior to executing any mesh simulation. Points or vertices defining the discrete patches may be referred to as surface points. Each surface point (e.g., surface point 320) may have an initial surface point position. The initial surface point position may be an initial position of the surface point prior to executing any mesh simulation.

A finite element mesh may define the model 200. A finite element mesh (e.g., a voxel mesh) may include individual elements having a regular and uniform shape and/or size in some examples. Such elements may be referred to as regular elements. Each finite element in the finite element mesh can be one of a 4-node tetrahedron, 5-node pyramid, 6-node pentahedron, 8-node hexahedron, 10-node tetrahedron, 13-node pyramid, 15-node pentahedron, 20-node hexahedron, or the like. The element geometry defined by the number of nodes associated with the element and the element shape. In some examples, the element geometry are associated with shape functions or interpolation functions in the manner described. That is, each finite element in the finite element mesh is defined by its corresponding shape function or interpolation function.

Figure 4:
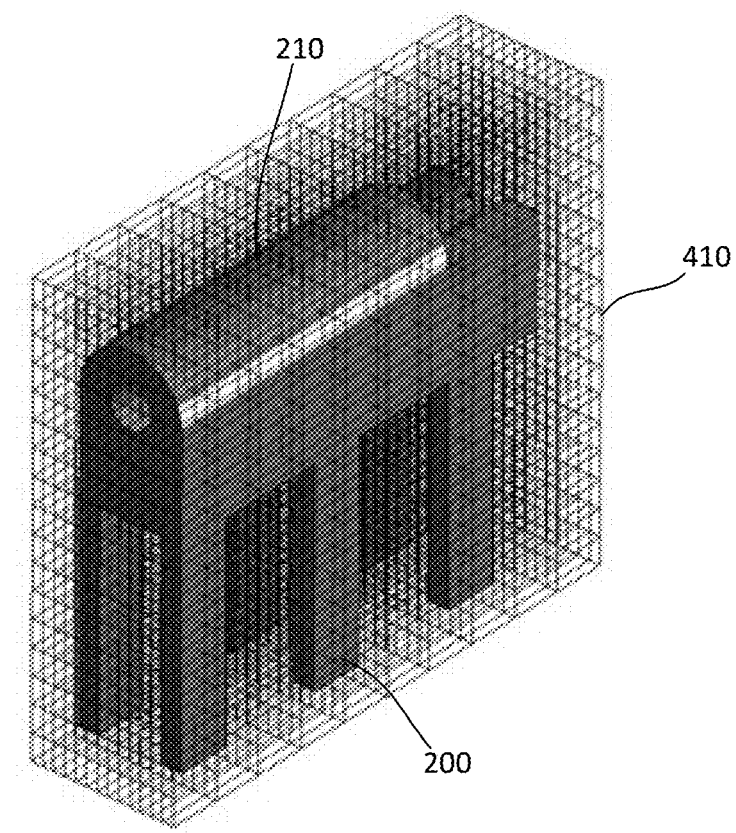
FIG. 4 is a diagram illustrating a finite element mesh defined for a model represented by a continuous surface representation according to some examples.

FIG. 4 is a diagram illustrating a finite element mesh 410 defined for the model 200 according to some examples. Referring to FIGS. 1-4, the finite element mesh 410 may be a voxel mesh that includes regular elements, each of which may be a rectangular cuboid. Thus, the finite element mesh 410 partitions the model 200 volume-wise and may appear grid-like in this non-limiting example. The finite element mesh 410 may be defined independently of the geometry of the model 200. As shown, the finite element mesh 410 may have a combined volume exceeding a volume of the model 200 enclosed by the surface 210 to ensure that every part of the model 200 included by a regular element.

In some examples, each initial NURBS surface position of the surface 210 may be within the finite element mesh 410. In some examples, each initial control point position of the surface 210 may be within or on the surface of the finite element mesh 410. In some examples, the initial control point positions may be associated with idealized points within the finite element mesh (e.g., the finite element mesh 410). The idealized points may be defined by isoparametric coordinates. Such isoparametric coordinate locations may be stored in a memory (e.g., the memory 104 and/or the database 160) of the system 100.

Figure 5:
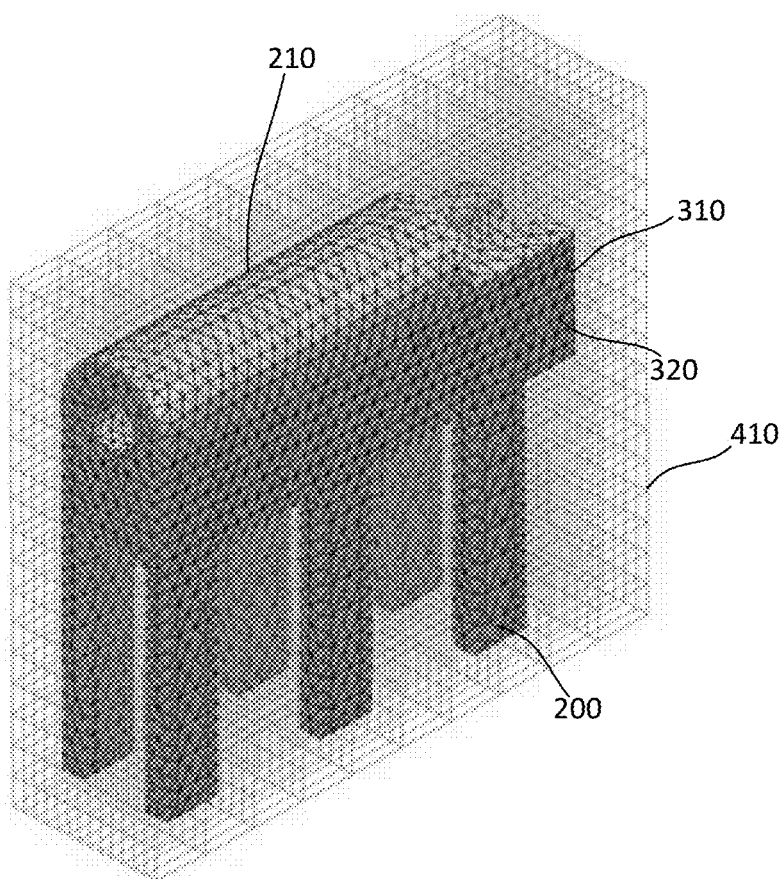
FIG. 5 is a diagram illustrating a finite element mesh defined for a model represented by a discrete surface representation according to some examples.

FIG. 5 is a diagram illustrating the finite element mesh 410 (FIG. 4) defined for the model 200 (FIG. 2) according to some examples. Referring to FIGS. 1-5, the surface 210 of the model 200 may be defined by the discrete patches (e.g., discrete patch 310) shown in FIG. 3. In some examples, each discrete patch at an initial state (e.g., the state in which the FEA or FEM has not yet been performed) may be defined by the initial discrete patch positions. In some examples, each initial discrete patch position of the model 200 may be within the finite element mesh 410. In some examples, each initial surface point position of the model 200 may be within the finite element mesh 410. In some examples, the initial surface point positions can be likewise associated with idealized points within or on the surface of the finite element mesh 410. the finite element mesh (e.g., the finite element mesh 410). The idealized points may be defined by isoparametric coordinates. Such isoparametric coordinate locations may be stored in a memory (e.g., the memory 104 and/or the data base 160) of the system 100.

In some examples, the behavior of a point (e.g., the idealized points) within or on the surface of the finite element mesh 410 can be determined with respect to the behavior of the nodes or integration points of the finite elements.

FEM and FEA may be performed using the finite element mesh 410 to obtain mesh simulation results. For instance, finite element calculations may be performed to obtain numerical results such as deformation with respect to the model 200 based on the nodes or grid points in the finite element mesh 410. In further examples, FEM an FEA may be used to obtain secondary quantities such as gradients, strains, stresses, state variables at other arbitrary locations. These arbitrary locations may include the integration points that are typically used in FEM and FEA calculations.

Multiple algorithms exist to map arbitrary values (e.g., mesh simulation results) associated with a collection of points (e.g., nodes or integration points in a mesh) to the idealized points. These algorithms (labeled mapping functions) include, but are not limited to:
1. using Finite Element (FE) interpolation functions to map arbitrary values at node locations to the idealized points;
2. using a weighted averaging procedure to map arbitrary values at node locations to the idealized points; or
3. using a weighted averaging procedure to map arbitrary values from an arbitrary collection of locations which may include node locations, integration point locations, or some arbitrary location.

Such mapping function may be selected or used by the mapping module 130 of the system 100.

Accordingly, the change of any idealized point (associated with, for example, one or more of the initial NURBS surface positions, initial control point positions, initial discrete patch positions, initial surface point positions, or the like) within or on the surface of the finite element mesh 410 may be determined based on the mapping function. In other words, behaviors (embodied in mesh simulation results or numerical results) determined based on FEM or FEA can be translated into the arbitrary results with respect to the surface representation based on the mapping.

Figure 6:
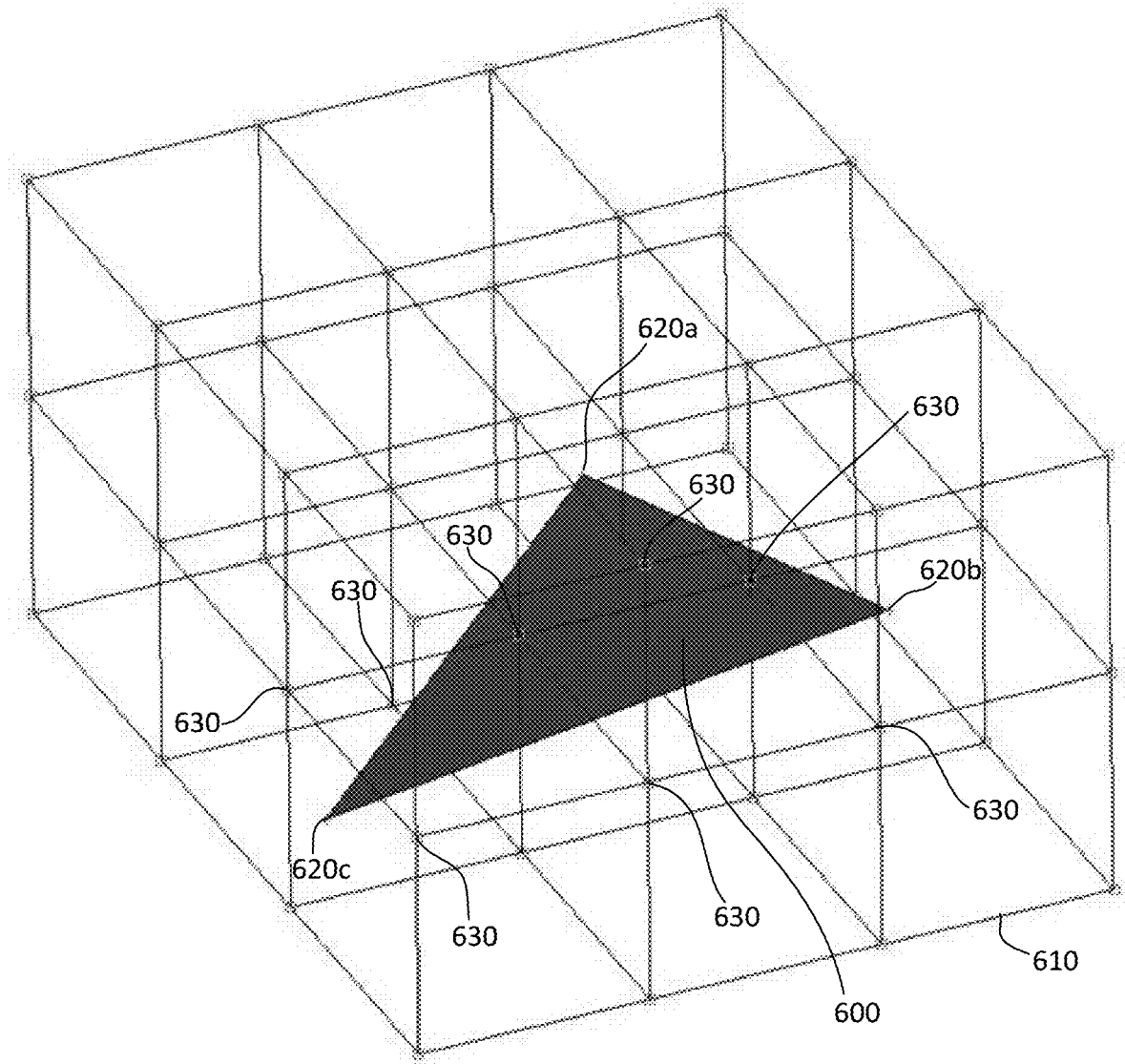
FIG. 6 is a diagram illustrating a perspective view of a discrete patch within a finite element mesh according to some examples.
Figure 7A:
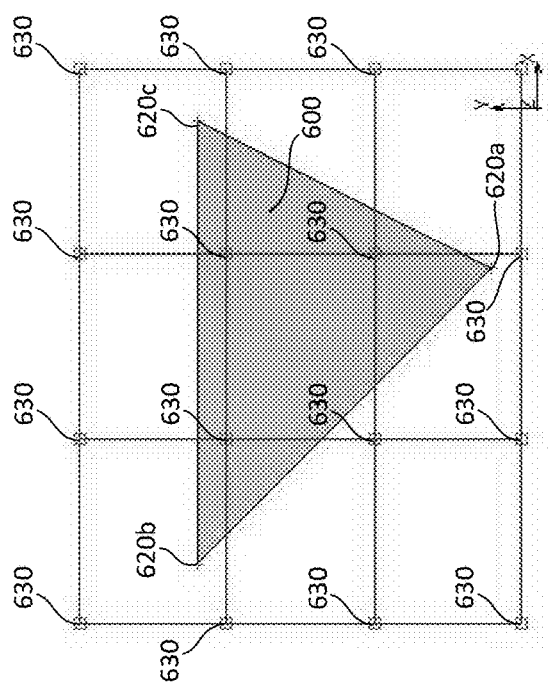
FIGS. 7A-7C illustrate, respectively, top, side, and front views of the discrete patch and the finite element mesh shown in FIG. 6.
Figure 7C:
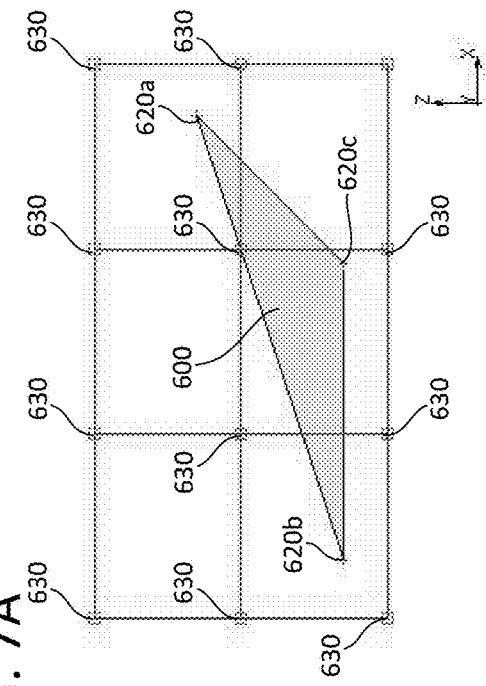
Figure 7B:
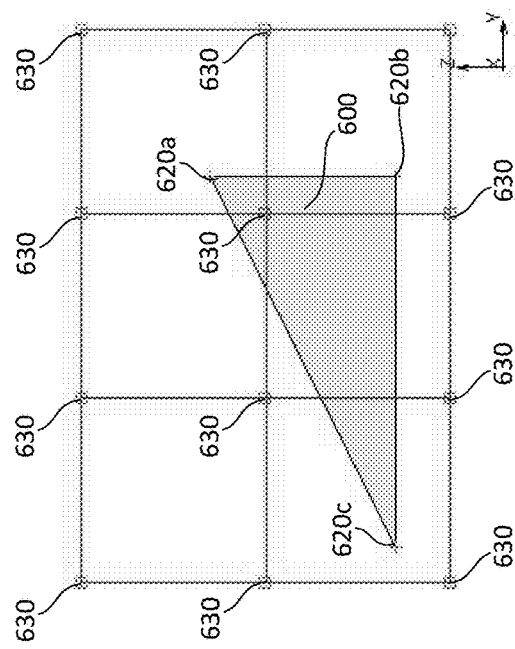

FIG. 6 is a diagram illustrating a perspective view of a discrete patch 600 within a finite element mesh 610 according to some examples. The finite elements of the finite element mesh 610 may be defined by nodes 630. FIGS. 7A-7C illustrate, respectively, top, side, and front views of the discrete patch 600 and the finite element mesh 610. Referring to FIGS. 1-7C, the discrete patch 600 may be a part of the model 200 (e.g., the discretized surface 210) in some examples, and the finite element mesh 610 may be a part of the finite element mesh 410. The discrete patch 600 may be a discretized single surface segment of the surface 210. Initial surface point positions 620a-620c may define the initial position of the discrete patch 600. Each of the initial surface point positions 620a-620c may be enclosed by the finite element mesh 610 (410). In other words, the initial surface point positions 620a-620c may be mapped to or otherwise associated with idealized points. The idealized points are enclosed in or on the surface of the finite element mesh 610.

Mesh simulation results from simulations (e.g., FEM and FEA) on the finite element mesh 610 may include deformation information with respect to the nodes 630 of the finite element mesh 610. As described, the deformation information with respect to the nodes 630 may be mapped into changes to the initial surface point positions 620a-620c using the mapping mechanisms described herein. The changes to the initial surface point positions 620a-620c may, in turn, define changes to the discrete patch 600. Likewise, changes to other types idealized points (e.g., the initial control point positions, initial NURBS surface positions, initial discrete patch positions, or the like) enclosed by the finite element mesh 610 can be similarly obtained through the mapping relationship between the nodes and the idealized points.

The simulation for the finite element meshes 410 and 620 may be performed to obtain behaviors of a model over time. Positions of the surface points or control points defining the surface of the model 200 may change over time from the initial surface point positions or the initial control point positions due to different types of simulation performed. A position of a surface point at an arbitrary point in time may be referred to as an arbitrary surface point position. A position of a control point at an arbitrary point in time may be referred to as an arbitrary control point position.

Illustrating with a non-limiting example, at an arbitrary point in time, a displacement between an arbitrary surface point position and an initial surface point position may be determined based on deformation represented by a displacement between initial positions of one or more nodes (e.g., the nodes 630) in the mesh (e.g., the mesh 610) that are mapped to the initial surface point position and arbitrary positions of the one or more nodes in the mesh at the arbitrary point in time. In some examples, an idealized point may be at a same physical location as the corresponding arbitrary surface point position. Thus, the surface point can inherit the displacement and all other arbitrary quantities of the corresponding idealized point. Thus, all results determined based on the finite element mesh of the model can be represented geometrically on the discretized patches of the model based on the mapping between the node positions and the surface point positions.

Similarly, at an arbitrary point in time, a displacement between an arbitrary control point position and an initial control point position may be determined based on a deformation represented by a displacement between initial positions of one or more nodes (e.g., the nodes 630) in the mesh (e.g., the mesh 610) that are mapped to the initial control point position and arbitrary positions of the one or more nodes in the mesh at the arbitrary point in time. In some examples, an idealized point may be at a same physical location as the corresponding arbitrary control point position. Thus, the control point can inherit the displacement and all other arbitrary quantities of the corresponding idealized point. Thus, all results determined based on the finite element mesh of the model can be represented geometrically on the continuous surface or discretized surface based on the mapping.

In some examples, the arbitrary results may be displayed via the interface 170. For instance, contours, symbols, numbers, vectors, tensors, and/or the like may be used to show a state of the surface representation of the model as determined in the manner described, at arbitrary points in time defined for the simulation. Illustrating with a non-limiting example, deformations of a discretized surface may be scaled or otherwise determined at an arbitrary time and added to the initial discretized surface. Thus, a report of the change in the surface representation of the model can be generated accordingly. In addition, given that the simulation may involve responses of the finite element mesh over time, a time history of the various states of the surface representation may be stored and displayed.

Figure 8:
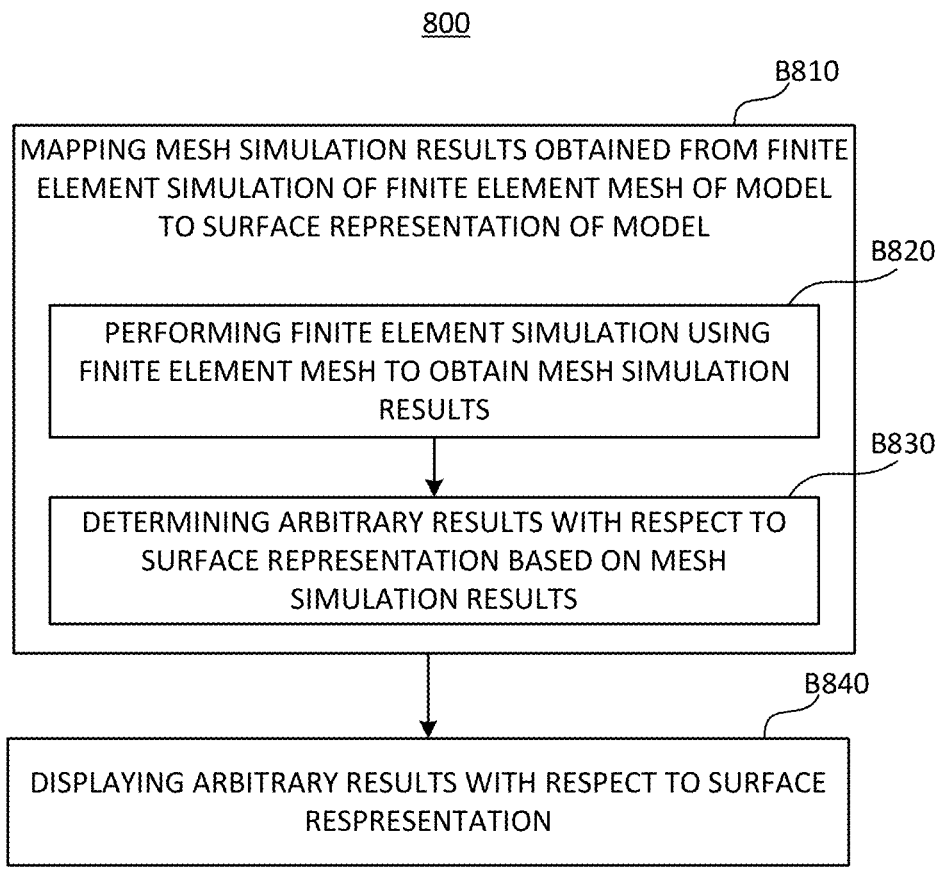
FIG. 8 is a process flow diagram illustrating an example of a method for performing a simulation of a model of a physical object.

FIG. 8 is a process flow diagram illustrating an example of a method 800 for performing a simulation of a model (e.g., the model 200 of FIG. 2) of a physical object. Referring to FIGS. 1-8, at block B810, the processor 106 (e.g., the mapping module 130) may map mesh simulation results obtained from a finite element simulation of the finite element mesh 410 (610) of the model 200 to a surface representation (e.g., 210) of the model 200. Block B810 may include blocks B820 and B830.

At B820, the processor 106 (e.g., the simulation module 150) may perform the finite element simulation using the finite element mesh 410 (610) to obtain the mesh simulation results. At B830, the processor 106 (e.g., the mapping module 130) may determine arbitrary results with respect to the surface representation 210 based on the mesh simulation results. That is, processor 106 (e.g., the mapping module 130) may map the mesh simulation results with respect to the nodes or the integration points to the idealized points using a mapping function as described herein. At block B840, the interface 170 may display the arbitrary results with respect to the surface representation.

While examples described herein illustrate various selection methods using a mouse cursor, the input device of the interface 170 can provide other mechanisms to receive user selection such as, but not limited to, touch screen, voice input, and the like.

The terms "system," "logic," "module," "data processing apparatus," or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary examples are illustrative only. Although only a few examples have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. Other substitutions, modifications, changes, and omissions can be made in the design, operating conditions and arrangement of the exemplary examples without departing from the scope of the present disclosure.

The present disclosure contemplates methods, systems and program products on any machine-readable media for accomplishing various operations. The examples of the present disclosure can be implemented using existing computer processors, or by a special purpose computer processor for an appropriate system, incorporated for this or another purpose, networked systems or by a hardwired system. Examples within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions can be executed on any type of computing device (e.g., computer, laptop, etc.) or can be embedded on any type of electronic device (e.g., a portable storage device such as a flash drive, etc.).

Although the figures can show a specific order of method steps, the order of the steps can differ from what is depicted. Also, two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision step.

What is claimed is:

1. A method for performing simulation of a model of a physical object, the method comprising:
   mapping mesh simulation results obtained from a finite element simulation of a finite element mesh of the model to a surface representation of the model by:
      determining the mesh simulation results corresponding to nodes or integration points of the finite element mesh by performing the finite element simulation using the finite element mesh, the mesh simulation results comprising numerical results; and
      after determining the mesh simulation results, determining arbitrary results with respect to the surface representation based on the mesh simulation results by translating the mesh simulation results corresponding to the nodes or the integration points of the finite element mesh to arbitrary results corresponding to points that define the surface representation; and
   displaying the arbitrary results with respect to the surface representation, wherein the finite element mesh is defined independently of the surface representation, wherein
   the surface representation of the model comprises one or more Non-Uniform Rational Basis Spline (NURBS) surfaces;
   each of the one or more NURBS surfaces is defined by one or more control points and one or more knot vectors associated with the one or more control points;
   each of the one or more control points has an initial control point position;
   each initial control point position is associated with an idealized point;
   the idealized point is a point within a volume of or on a surface of the finite element mesh;
   the idealized point is defined by isoparametric coordinates;
   performing the finite element simulation using the finite element mesh to obtain the mesh simulation results comprises determining the mesh simulation results with respect to the nodes or the integration points of the finite element mesh;
   determining the arbitrary results with respect to the surface representation based on the mesh simulation results comprises mapping the mesh simulation results with respect to the nodes or the integration points to the idealized points using a mapping function;
   each of the idealized points is at a same physical location as a corresponding control point; and
   each of the control points inherit displacement and all other arbitrary quantities of the corresponding idealized point.

2. The method of claim 1, wherein:
   the model is a 3-dimensional solid;
   performing the finite element simulation using the finite element mesh comprises performing the finite element simulation using Finite Element Method (FEM) or Finite Element Analysis (FEA).

3. The method of claim 1, wherein:
   each finite element of the finite element mesh is associated with a shape function or interpolation function; and
   each finite element of the finite element mesh is one of a 4-node tetrahedron, 5-node pyramid, 6-node pentahedron, 8-node hexahedron, 10-node tetrahedron, 13-node pyramid, 15-node pentahedron, or 20-node hexahedron.

4. The method of claim 1, wherein the mapping function is based on interpolation functions of elements of the finite element mesh or based on a weighted average of a collection of nearby nodes.

5. The method of claim 1, wherein the mesh simulation results comprise deformation information for the nodes or the integration points of the finite element mesh.

6. A method for performing simulation of a model of a physical object, the method comprising:
   mapping mesh simulation results obtained from a finite element simulation of a finite element mesh of the model to a surface representation of the model by:
      determining the mesh simulation results corresponding to nodes or integration points of the finite element mesh by performing the finite element simulation using the finite element mesh, the mesh simulation results comprising numerical results; and
      after determining the mesh simulation results, determining arbitrary results with respect to the surface representation based on the mesh simulation results by translating the mesh simulation results corresponding to the nodes or the integration points of the finite element mesh to arbitrary results corresponding to points that define the surface representation; and
   displaying the arbitrary results with respect to the surface representation, wherein the finite element mesh is defined independently of the surface representation, wherein
   the surface representation comprises discrete patches;
   each of the discrete patches is defined by one or more discrete patch positions or surface points;
   each of the one or more surface points has an initial surface point position;
   each initial surface point position is associated with an idealized point;
   the idealized point is a point within a volume of or on a surface of the finite element mesh;
   the idealized point is defined by isoparametric coordinates;
   performing the finite element simulation using the finite element mesh to obtain the mesh simulation results comprises determining the mesh simulation results with respect to the nodes or the integration points of the finite element mesh;

determining the arbitrary results with respect to the surface representation based on the mesh simulation results comprises mapping the mesh simulation results with respect to the nodes or the integration points of the finite element mesh to the idealized points using a mapping function;

each of the idealized points is at a same physical location as a corresponding surface point; and each of the surface points inherit displacement and all other arbitrary quantities of the corresponding idealized point.

7. The method of claim 6, wherein the mapping function is based on interpolation functions of elements of the finite element mesh or based on a weighted average of a collection of nearby nodes.

8. A non-transitory computer-readable medium having computer-readable instructions such that, when executed by a processor, causes the processor to perform the method of claim 6.

9. An apparatus capable of performing simulation of a model of a physical object, the apparatus comprises:
a memory; and
a processor configured to perform the method of claim 6.

10. A non-transitory computer-readable medium having computer-readable instructions such that, when executed by a processor, causes the processor to perform simulation of a model of a physical object by:

mapping mesh simulation results obtained from a finite element simulation of a finite element mesh of the model to a surface representation of the model by:
determining the mesh simulation results corresponding to nodes or integration points of the finite element mesh by performing the finite element simulation using the finite element mesh, the mesh simulation results comprising numerical results; and
after determining the mesh simulation results, determining arbitrary results with respect to the surface representation based on the mesh simulation results by translating the mesh simulation results corresponding to the nodes or the integration points of the finite element mesh to arbitrary results corresponding to points that define the surface representation; and displaying the arbitrary results with respect to the surface representation, wherein the finite element mesh is defined independently of the surface representation, wherein the surface representation of the model comprises one or more Non-Uniform Rational Basis Spline (NURBS) surfaces;

each of the one or more NURBS surfaces is defined by one or more control points and one or more knot vectors associated with the one or more control points;

each of the one or more control points has an initial control point position;

each initial control point position is associated with an idealized point;

the idealized point is a point within a volume of or on a surface of the finite element mesh;

the idealized point is defined by isoparametric coordinates;

performing the finite element simulation using the finite element mesh to obtain the mesh simulation results comprises determining the mesh simulation results with respect to the nodes or the integration points of the finite element mesh;

determining the arbitrary results with respect to the surface representation based on the mesh simulation results comprises mapping the mesh simulation results with respect to the nodes or the integration points to the idealized points using a mapping function;

each of the idealized points is at a same physical location as a corresponding control point; and each of the control points inherit displacement and all other arbitrary quantities of the corresponding idealized point.

11. An apparatus capable of performing simulation of a model of a physical object, the apparatus comprises:
a memory;
a processor configured to:
map mesh simulation results obtained from a finite element simulation of a finite element mesh of the model to a surface representation of the model by:
determining the mesh simulation results corresponding to nodes or integration points of the finite element mesh by performing the finite element simulation using the finite element mesh to obtain the mesh simulation results; and
after determining the mesh simulation results, determining arbitrary results with respect to the surface representation based on the mesh simulation results by translating the mesh simulation results corresponding to the nodes or the integration points of the finite element mesh to arbitrary results corresponding to points that define the surface representation; and a user interface configured to display the arbitrary results with respect to the surface representation, wherein the finite element mesh is defined independently of the surface representation, wherein the surface representation of the model comprises one or more Non-Uniform Rational Basis Spline (NURBS) surfaces;

each of the one or more NURBS surfaces is defined by one or more control points and one or more knot vectors associated with the one or more control points;

each of the one or more control points has an initial control point position;

each initial control point position is associated with an idealized point;

the idealized point is a point within a volume of or on a surface of the finite element mesh;

the idealized point is defined by isoparametric coordinates;

performing the finite element simulation using the finite element mesh to obtain the mesh simulation results comprises determining the mesh simulation results with respect to the nodes or the integration points of the finite element mesh;

determining the arbitrary results with respect to the surface representation based on the mesh simulation results comprises mapping the mesh simulation results with respect to the nodes or the integration points to the idealized points using a mapping function;

each of the idealized points is at a same physical location as a corresponding control point; and each of the control points inherit displacement and all other arbitrary quantities of the corresponding idealized point.

* * * * *